(12) United States Patent
Hong

(10) Patent No.: US 6,440,848 B1
(45) Date of Patent: Aug. 27, 2002

(54) INTERCONNECTION OF A SEMICONDUCTOR DEVICE AND A METHOD OF FORMING THEREOF

(75) Inventor: Jeong-Eui Hong, Cheongju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/610,887

(22) Filed: Jul. 6, 2000

(30) Foreign Application Priority Data

Jul. 9, 1999 (KR) .......................................... 99/27748

(51) Int. Cl.$^7$ .............................................. H01L 21/44
(52) U.S. Cl. ...................... 438/649; 438/630; 438/648; 438/655; 438/693
(58) Field of Search .................... 438/629, 643, 438/648, 649, 655, 656, 658, 659, 660, 663, 664, 682, 683, 630

(56) References Cited

U.S. PATENT DOCUMENTS 6,180,522 B1 * 1/2001 Hong ........................ 438/659

6,221,762 B1 * 4/2001 Byun et al. ................ 438/643

OTHER PUBLICATIONS

Telford et al., J. Electrochem. Soc., vol. 140, No. 12, 3689–3701 (1993).
Byun et al., J. Electrochem. Soc., vol. 144, No. 10, 3572–3582 (1997).

* cited by examiner

Primary Examiner—Kevin M. Picardat
(74) Attorney, Agent, or Firm—Birch, Stewart, Kolasch & Birch, LLP

(57) ABSTRACT

A method for forming an interconnection of a semiconductor device including a step of sequentially stacking a first insulation layer, a first semiconductor layer, a barrier metal layer and a second semiconductor layer on a semiconductor substrate, a step of forming an amorphous first tungsten silicide layer on the second semiconductor layer, a step of transforming the first tungsten silicide layer into a second tungsten silicide layer having a tetragonal crystal structure by an annealing process; a step of forming an etching mask on the second tungsten silicide layer, and a step of sequentially selectively etching the second tungsten silicide layer, the second semiconductor layer, the barrier metal layer and the first semiconductor layer by employing the etching mask.

27 Claims, 6 Drawing Sheets

INTERCONNECTION OF A SEMICONDUCTOR DEVICE AND A METHOD OF FORMING THEREOF

BACKGROUND OF THE INVENTION

1. Field of the Invention

The present invention relates to a fabrication method of a semiconductor device, and in particular to a method for forming an interconnection of a semiconductor device having a low resistance.

The present invention also relates to an interconnection of a semiconductor device having low resistance.

2. Description of the Background Art

FIG. 1 is a graph illustrating the variation of line resistance as a function of the line width of an interconnection of a semiconductor device.

The X axis and the Y axis depict the line width and line resistance values of the interconnection, respectively. Plot "A" shows the resistance of a polycide interconnection formed by stacking a tungsten silicide layer on pure, undoped polysilicon, and plot "B" shows the resistance of a polycide interconnection formed by stacking the tungsten silicide layer on doped polysilicon. The tungsten silicide layer is of tetragonal crystal structure and is deposited by a chemical vapor deposition process and annealed.

In plots A and B, the thickness of the polysilicon layer and tungsten silicide layer which are deposited is 1000 Å and 1500 Å, respectively. The annealing process is carried out on the tungsten silicide layer at a temperature of 1000° C. for 30 seconds.

As is apparent from FIG. 1, the resistance of the interconnection is lower when the doped polysilicon is used, as in plot B, than when the pure polysilicon is employed, as in plot A.

FIGS. 2A to 2D are cross-sectional views illustrating sequential steps of a method for forming an interconnection of a semiconductor device in accordance with a first example of the conventional art.

Referring to FIG. 2A, a first insulation layer (gate oxide film) 2 is formed on a semiconductor substrate 1, and a semiconductor layer 3 and a first tungsten silicide layer 4 are sequentially deposited on the first insulation layer 2.

The first insulation layer is a silicon oxide film formed in accordance with a thermal oxidation or chemical vapor deposition process. The semiconductor layer 3 consists of a doped polysilicon layer, and the first tungsten silicide layer 4 is deposited according to a chemical vapor deposition process.

As illustrated in FIG. 2B, a second tungsten silicide layer 5, having a tetragonal crystal structure, is formed by annealing the first tungsten silicide layer 4 at a high temperature. As a result, the interface between the semiconductor layer 3 and the second tungsten silicide layer 5 becomes uneven. This occurs because silicon of the semiconductor layer 3 diffuses into the first tungsten silicide layer 4.

As shown in FIG. 2C, an etching mask 6 is formed in order to define an interconnection. The etching mask 6 is formed by sequentially stacking a second insulation layer 6a and a third insulation layer 6b on the second tungsten silicide layer 5, and by etching and patterning the stacked layers by using a photoresist pattern.

The second insulation layer 6a consists of silicon oxide $SiO_2$, and the third insulation layer 6b consists of silicon nitride $Si_3N_4$.

Referring to FIG. 2D, the second tungsten silicide layer 5, the semiconductor layer 3 and the first insulation layer 2 are selectively etched and removed by using the etching.mask 6, thereby finishing the conventional process for forming an interconnection of a semiconductor device.

The above-described method for forming an interconnection of a semiconductor device has a disadvantage in that the interface between the semiconductor layer 3 and the tungsten silicide layer 5 becomes uneven, and thus, during the etching process for forming the interconnection, a residual 9 (refer to FIG. 2D) of the tungsten siuicide layer 5 or the semiconductor layer 3 remains on the insulation layer 2, thereby causing damage of the insulation layer 2 and reducing the reliability of the semiconductor device.

Another example of a conventional method for forming an interconnection of a semiconductor device will now be described with reference to FIGS. 3a to 3C.

As shown in FIG. 3A, an impurity region 11 is formed in a predetermined portion of a semiconductor substrate 10. An insulation layer 12 is formed on the semiconductor substrate 10. The insulation layer 12 is etched so that an upper surface of the impurity region 11 can be exposed, thereby forming a contact hole 12A. Thereafter, a semiconductor layer 13 is formed at the upper surface of the insulation layer 12, and inner walls and bottom surface of the contact hole 12a. A first tungsten silicide layer 14 is formed on the semiconductor layer 13.

The insulation layer 12 consists of one of borophosphosilicate glass (BPSG), spin-on glass (SOG) and plasma-enhanced tetraethylorthosilicate (PE-TEOS). The semiconductor layer 13 consists of a p-type or n-type doped polysilicon layer. The first tungsten silicide layer 14 is formed according to a chemical vapor deposition process.

Referring to FIG. 3B, a second tungsten silicide layer 15, of a tetragonal crystal structure and having a low resistance, is formed by annealing the first tungsten silicide layer 14. Accordingly, the interface between the semiconductor layer 13 and the second tungsten silicide layer 15 becomes uneven. This occurs because silicon of the semiconductor layer 13 diffuses into the first tungsten silicide layer 14 during the annealing process.

As illustrated in FIG. 3C, the semiconductor layer 13 and the second tungsten silicide layer 15 on the insulation layer 12 are removed according to a chemical mechanical polishing (CMP) process or etching process so that the upper portion of the insulation film 12 can be exposed. As a result, the second tungsten silicide layer 15 and the semiconductor layer 13 remain only in the contact hole 12A, thereby finishing the conventional method for forming an interconnection of a semiconductor device.

As described above in relation to the first example of a conventional method, this second example of a conventional method for forming an interconnection of a semiconductor device has a disadvantage in that the interface between the semiconductor layer 13 and the tungsten silicide layer 15 is uneven. Thus, during the etching or CMP process for forming the interconnection, a residual 19 (refer to FIG. 3C) of the tungsten silicide layer 15 or semiconductor layer 13 remains on the insulation layer 12, thereby causing a bridge among interconnections or damage of the insulation layer 12, and reducing the reliability of the semiconductor device.

SUMMARY OF THE INVENTION

Accordingly, it is an object of the present invention to provide a method for forming an interconnection of a semiconductor device which can improve reliability by positioning a barrier metal layer between a semiconductor layer and a tungsten silicide layer.

In order to achieve the above-described object of the present invention, there is provided a method for forming an interconnection of a semiconductor device in accordance with a first embodiment of the present invention, including: forming a first insulation layer over a semiconductor substrate, forming a first semiconductor layer over the first insulation layer, forming a barrier metal layer over the first semiconductor layer, forming a second semiconductor layer over the barrier metal layer, forming an amorphous first tungsten silicide layer over the second semiconductor layer, annealing the amorphous first tungsten silicide layer to form a second tungsten silicide layer having a tetragonal crystal structure, forming an etching mask over the second tungsten silicide layer in order to define the interconnection, and etching the second tungsten silicide layer, the second semiconductor layer, the barrier metal layer and the first semiconductor layer sequentially and preferentially by employing the etching mask.

There is also provided a method for forming an interconnection of a semiconductor device in accordance with a second embodiment of the present invention, including: providing a semiconductor substrate having an impurity region at its surface, forming an insulation layer having a contact hole over the impurity region, forming a first semiconductor layer at inner walls and a bottom surface of the contact hole and over the insulation layer, forming a barrier metal layer over the first semiconductor layer, forming a second semiconductor layer over the barrier metal layer, forming an amorphous first tungsten silicide layer over the second semiconductor layer, annealing the amorphous first tungsten silicide layer to form a second tungsten silicide layer having a tetragonal crystal structure, and etching back the second tungsten silicide layer, the second semiconductor layer, the barrier metal layer and the first semiconductor layer sequentially and selectively so that an upper portion of the insulation layer can be exposed.

It is also an object of the present invention to provide an interconnection of a semiconductor device made up of a first insulation layer formed over a semiconductor substrate, a first semiconductor layer formed over a portion of the first insulation layer, a barrier metal layer formed over the first semiconductor layer, a second semiconductor layer formed over the barrier metal layer, and a tungsten silicide layer having a tetragonal crystal structure formed over the second semiconductor layer.

There is also provided an interconnection of a semiconductor device made up of a semiconductor substrate having an impurity region at its surface, an insulation layer formed over the semiconductor substrate having a contact hole over the impurity region, a first semiconductor layer formed at inner walls and a bottom surface of the contact hole, a barrier metal layer formed over the first semiconductor layer, a second semiconductor layer formed over the barrier metal layer, and a tungsten silicide layer having a tetragonal crystal structure formed over the second semiconductor layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A method for forming an interconnection of a semiconductor device in accordance with a first embodiment of the present invention will now be described with reference to FIGS. 4A to 4E.

Figure 1:
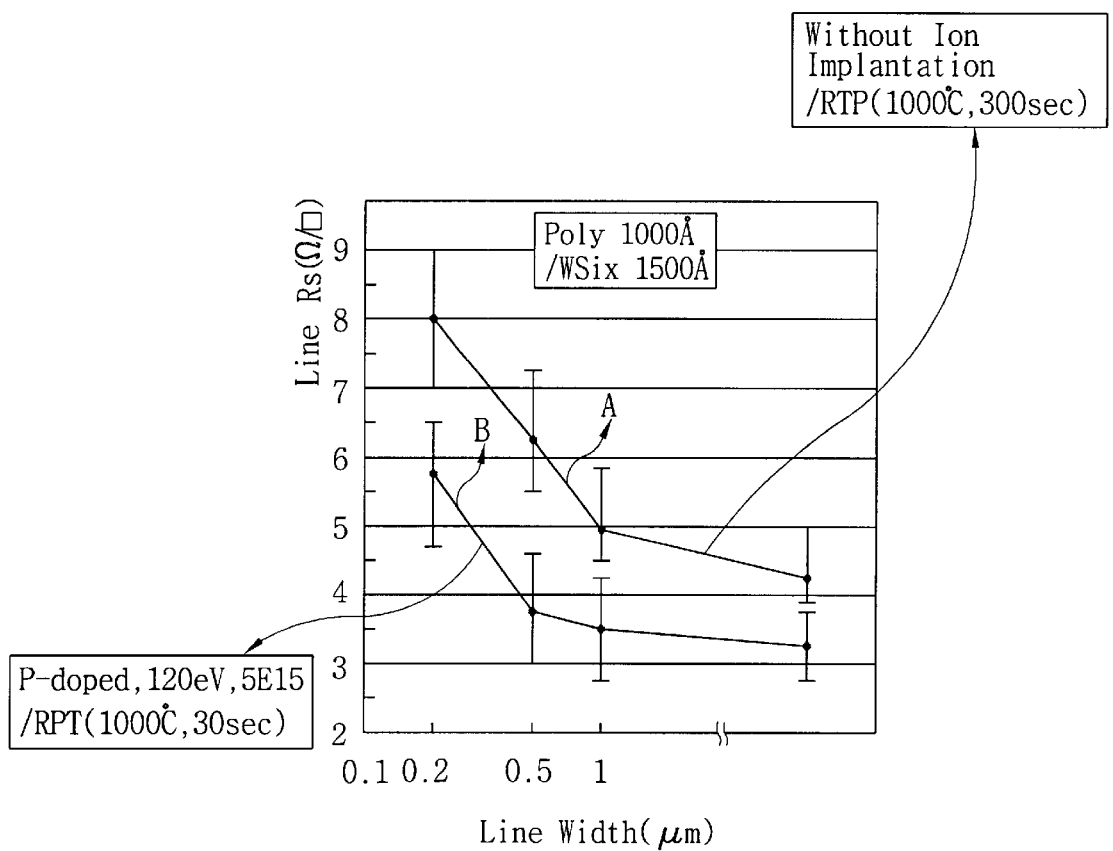
FIG. 1 is a graph showing a variation of line resistance as a function of line width of an interconnection.
Figure 2A:
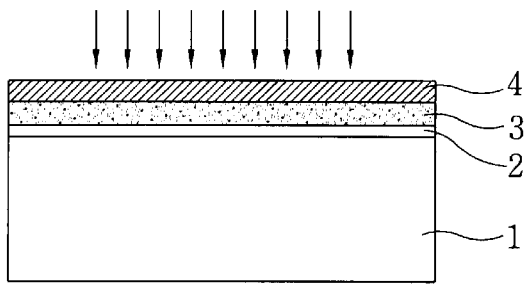
FIGS. 2A to 2D are cross-sectional views illustrating sequential steps of a method for forming an interconnection of a semiconductor device in accordance with a first example of the conventional art.
Figure 2B:
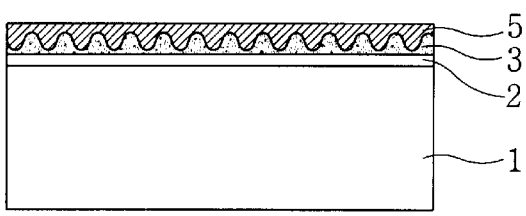
Figure 2C:
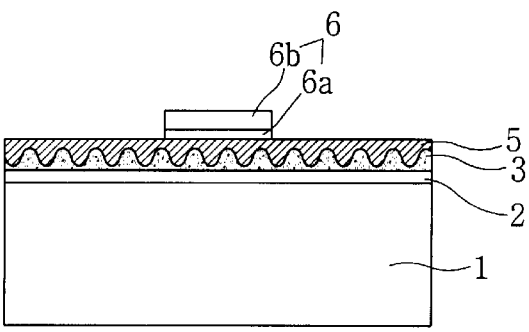
Figure 2D:
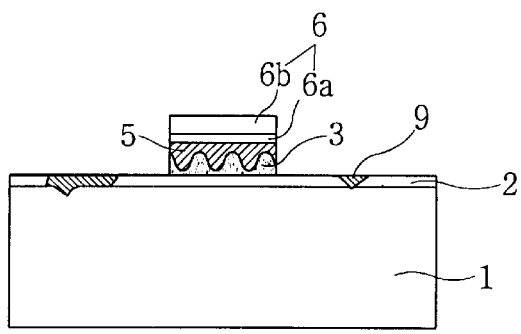
Figure 3A:
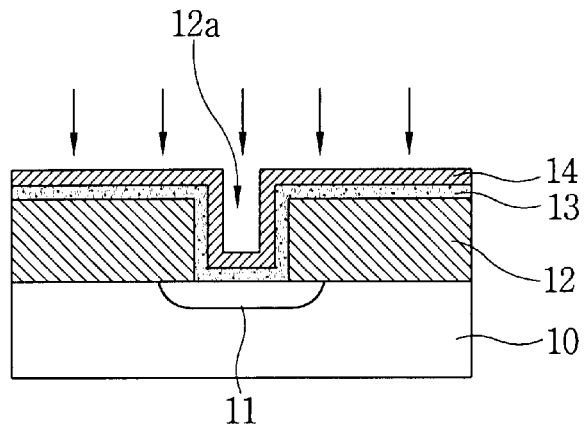
FIGS. 3A to 3C are cross-sectional views illustrating sequential steps of a method for forming an interconnection of a semiconductor device in accordance with a second example of the conventional art.
Figure 3B:
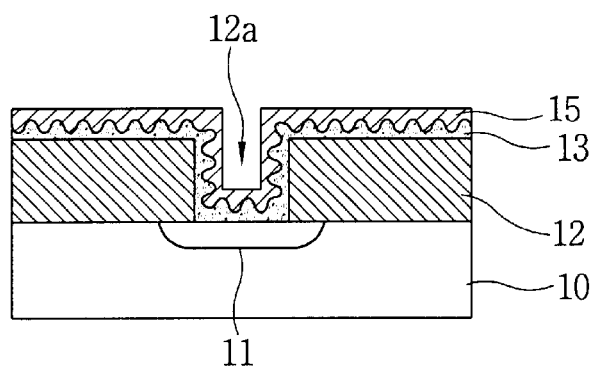
Figure 3C:
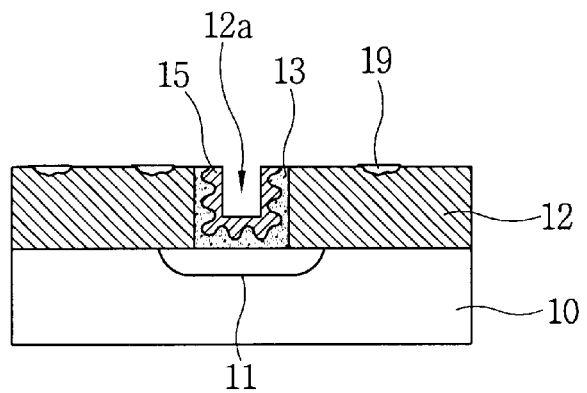
Figure 4A:
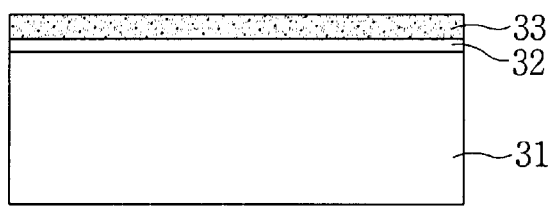
FIGS. 4A to 4E are cross-sectional views illustrating sequential steps of a method for forming an interconnection of a semiconductor device in accordance with a first embodiment of the present invention.

Referring to FIG. 4A, a first insulation layer 32, namely, a gate oxide film, is formed on a semiconductor substrate 31, and a first semiconductor layer 33 is formed on the first insulation layer 32.

The first insulation layer 32 can be a silicon oxide layer formed by oxidation of the surface of the substrate 31 or, alternatively, a silicon nitride layer could be deposited as the first insulation layer 32. The first semiconductor layer 33 has a film thickness of about 300 to 500 Å, and can be a p-type or n-type doped silicon layer.

Figure 4B:
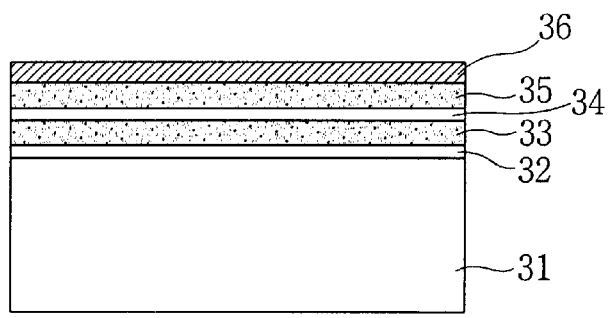

As shown in FIG. 4B, a barrier metal layer 34, a second semiconductor layer 35 and an amorphous first tungsten silicide layer 36 are sequentially stacked on the first semiconductor layer 33.

The barrier metal layer 34 can be one of TiN, Ti/TiN and TiW. The second semiconductor layer 35 can be a p-type or n-type doped silicon layer having a film thickness of about 50 to 300 Å. The first tungsten silicide layer 36 can be $WSi_2$ and is formed, under vacuum, to have a thickness of about 700 to 1800 Å according to a chemical vapor deposition process.

Figure 4C:
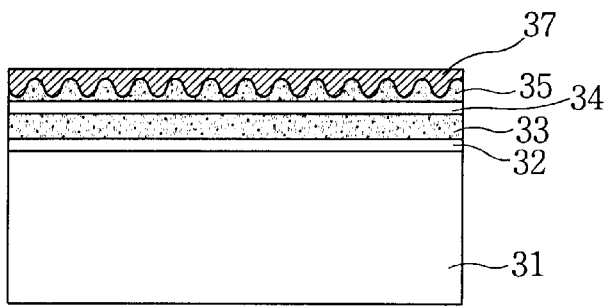

As shown in FIG. 4C, a second tungsten silicide layer 37 having a tetragonal crystal structure is formed by annealing the first tungsten silicide layer 36 at a high temperature.

The annealing process is performed in a furnace under a nitrogen atmosphere at a temperature of 900 to 1200° C. for 10 to 40 minutes. During the annealing process, the barrier metal layer 34 prevents impurities from the first tungsten silicide layer 36 from being diffused into the first semiconductor layer 33. After the annealing process, the interface between the second tungsten siuicide layer 37 and the second semiconductor layer 35 becomes uneven. This occurs because silicon from the second semiconductor layer 35 diffuses into the first tungsten silicide layer 36.

Figure 4D:
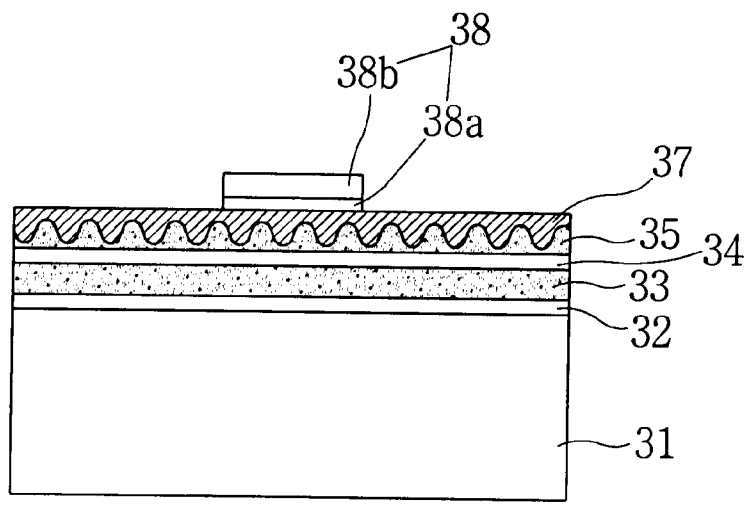

Thereafter, as shown in FIG. 4D, an etching mask 38 is formed on the second tungsten silicide layer 37 in order to define an interconnection. The etching mask 38 is formed by sequentially stacking a second insulation layer 38a and a third insulation layer 38b. The second insulation layer 38a can be a silicon oxide film, and the third insulation layer 38b can be a silicon nitride film.

Figure 4E:
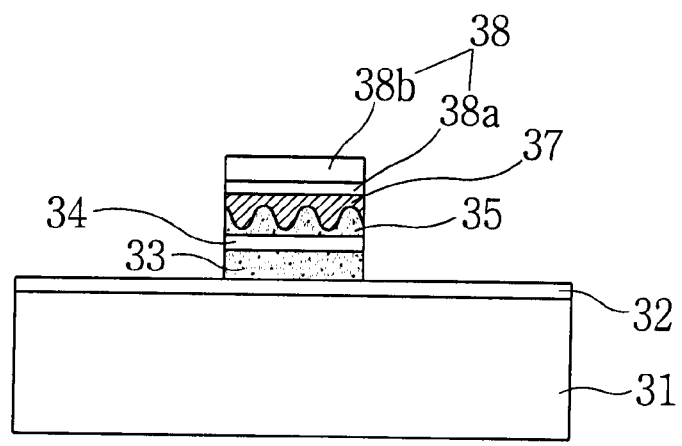

Referring to FIG. 4E, the second tungsten silicide layer 37, the second semiconductor layer 35, the barrier metal layer 34 and the first semiconductor layer 33 are selectively etched by using the etching mask 38, thereby finishing the process for forming an interconnection of a semiconductor device according to the first embodiment of the present invention.

The etching process includes a first etching step of etching the second tungsten silicide layer 37 and the second semiconductor layer 35, and a second etching step of etching the barrier metal layer 34 and the first semiconductor layer 33. As an etchant gas for etching the first semiconductor layer 33 and second semiconductor layer 35, $HBr+O_2$ can be employed. For etching the second tungsten silicide layer 37, $Cl_2+O_2$ can be employed. And, for etching the barrier metal layer 34, $Cl_2$ can be employed.

The barrier metal layer 34 serves as an etch stop layer preventing the first semiconductor layer 33 from being damaged during the first etching step.

A method for forming an interconnection of a semiconductor device in accordance with a second embodiment of the present invention will now be explained with reference to FIGS. 5A to 5D.

Figure 5A:
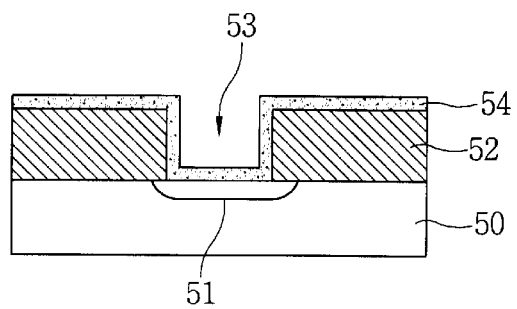
FIGS. 5A to 5D are cross-sectional views illustrating sequential steps of a method for forming an interconnection of a semiconductor device in accordance with a second embodiment of the present invention.

Referring to FIG. 5A, an impurity region 51 is formed at a surface of a semiconductor substrate 50. An insulation layer 52 is formed on the semiconductor substrate 50. The insulation layer 52 is selectively etched, thereby forming a contact hole 53 so that an upper portion of the impurity region 51 can be exposed. Thereafter, a first semiconductor layer 54 is formed at inner walls of the contact hole 53, at the upper surface of the impurity region 51 and at the upper portion of the insulation layer 52.

The insulation layer 52 can be one of SOG, BPSG and PE-TEOS, and the first semiconductor layer 54 can be a p-type or n-type doped silicon layer.

Figure 5B:
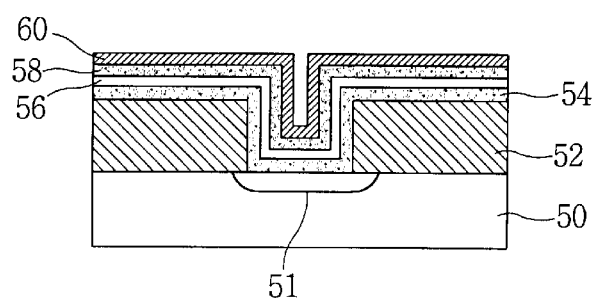

As illustrated in FIG. 5B, a barrier metal layer 56, a second semiconductor layer 58 and an amorphous first tungsten silicide layer 60 are sequentially stacked on the first semiconductor layer 54.

The barrier metal layer 56 can be one of TiN, Ti/TiN and TiW. The second semiconductor layer 58 can be a p-type or n-type doped silicon layer. The first tungsten silicide layer 60 is formed, under vacuum, to have a thickness of about 700 to 1800 Å according to a chemical vapor deposition process.

Figure 5C:
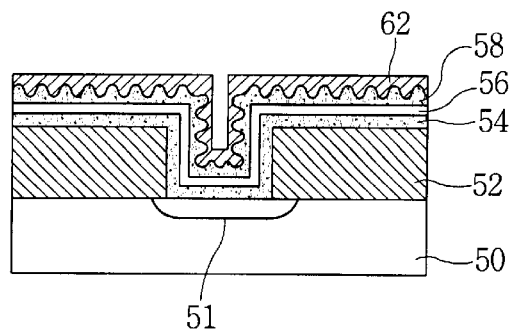

Referring to FIG. 5C, a second tungsten silicide layer 62 having a tetragonal crystal structure is formed by annealing the first tungsten silicide layer 60.

The annealing process is performed in a furnace under a nitrogen atmosphere at a temperature of about 900 to 12000 for about 10 to 40 minutes. The silicon of the second semiconductor layer 58 diffuses into the first tungsten silicide layer 60 during the annealing process. After the annealing process, the interface between the second semiconductor layer 58 and the second tungsten silicide layer 62 is uneven.

The second semiconductor layer 58 serves to provide the silicon required when the amorphous first tungsten silicide layer 60 is transformed according to the annealing process into the second tungsten silicide layer 62 having the tetragonal crystal structure. The barrier metal layer 56 prevents impurities from the first tungsten silicide layer 60 from diffusing into the first semiconductor layer 54 during the annealing process. However, the barrier metal layer 56 cannot completely prevent diffusion of impurities from the first tungsten silicide layer 60. Accordingly, the first semiconductor layer 54 finally prevents this diffusion of impurities.

Figure 5D:
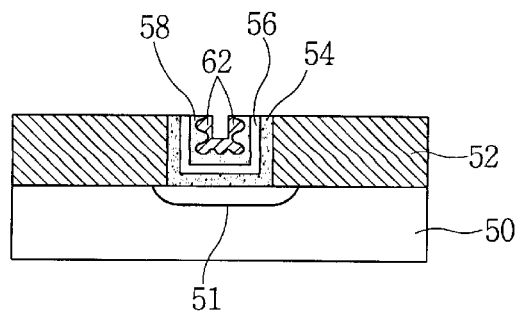

As shown in FIG. 5D, in order to define an interconnection, the second tungsten silicide layer 62, the second semiconductor layer .58, the barrier metal layer 56 and the first semiconductor layer 54 on the insulation layer 52 are selectively removed by a CMP process until an upper portion of the insulation layer 52 is exposed. The second tungsten silicide layer 62, the barrier metal layer 56 and the first semiconductor layer 54 remain only in the contact hole 52A, thereby finishing the process of forming the interconnection of the semiconductor device in accordance with the second embodiment of the present invention.

In addition, the CMP process can be replaced by an etch back process. The etch back process includes a first etching step of etching the second tungsten silicide layer 62 and the second semiconductor layer 58, and a second etching step of etching the barrier metal layer 56 and the first semiconductor layer 54. During etching of the first semiconductor layer 54 and second semiconductor layers 58, $HBr+O_2$ can be employed as an etchant gas. During etching of the second tungsten silicide layer 62, $Cl_2+O_2$ can be used and, during etching of the barrier metal layer 56, $Cl_2$ can be used.

The barrier metal layer 56 serves as an etch stop layer preventing the first semiconductor layer 54 from being damaged during the first etching step.

As discussed earlier, the method for forming an interconnection of a semiconductor device, in accordance with embodiments of the present invention, Atpositions the barrier metal layer between the first and second semiconductor layers 54 and 58, thereby preventing a bridge among interconnections and a loss of the insulation layer 52 (or gate oxide layer) when the second semiconductor layer 58 and the second tungsten silicide layer 62, having an uneven interface, are etched in order to form the interconnection. This results in improved reliability of the interconnection.

Furthermore, the amorphous first tungsten silicide layer 60 is transformed into the second tungsten silicide layer 62 of tetragonal crystal structure, having a considerably larger grain size, according to the annealing process. This reduces resistivity of the interconnection by half. As a result, the semiconductor device is improved in integration and speed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds, are therefore intended to be embraced by the appended claims.

What is claimed is:

1. A method for forming an interconnection of a semiconductor device, comprising:

forming a first insulation layer over a semiconductor substrate;

forming a first semiconductor layer over the first insulation layer;

forming a barrier metal layer over the first semiconductor layer;

forming a second semiconductor layer over the barrier metal layer;

forming an amorphous first tungsten silicide layer over the second semiconductor layer;

annealing the amorphous first tungsten silicide layer to form a second tungsten silicide layer having a tetragonal crystal structure;

forming an etching mask over the second tungsten silicide layer in order to define the interconnection; and etching the second tungsten silicide layer, the second semiconductor layer, the barrier metal layer and the first semiconductor layer sequentially and preferentially by employing the etching mask.

2. The method of claim 1, wherein the first insulation layer is a gate oxide layer.

3. The method of claim 2, wherein the first insulation layer is one chosen from the group consisting of a silicon oxide layer and a silicon nitride layer.

4. The method of claim 1, wherein the first and second semiconductor layers are doped silicon layers.

5. The method of claim 4, wherein the first and second semiconductor layers are doped with an identical impurity.

6. The method of claim 1, wherein the barrier metal layer consists of one chosen from the group consisting of TiN, Ti/TiN and TiW.

7. The method of claim 1, wherein the first tungsten silicide layer is formed by chemical vapor deposition.

8. The method of claim 1, wherein the annealing step is performed at a temperature between about 900 and 1200° C. for between about 10 and 40 minutes.

9. The method of claim 8, wherein the annealing step is performed under a nitrogen atmosphere.

10. The method of claim 8, wherein the barrier metal layer serves as a diffusion stop layer for preventing an impurity from the first tungsten silicide layer from being diffused into the first semiconductor layer during the annealing step.

11. The method of claim 1, wherein the etching mask includes a second insulation layer formed over the second tungsten silicide layer and a third insulation layer formed over the second insulation layer.

12. The method of claim 11, wherein the second insulation layer is a silicon oxide layer and the third insulation layer is a silicon nitride layer.

13. The method of claim 1, wherein the etching step comprises:

a first etching substep for etching the second tungsten silicide layer and the second semiconductor layer; and a second etching substep for etching the barrier metal layer and the first semiconductor layer.

14. The method of claim 1, wherein the etching step uses HBr+O$_2$ as an etchant gas for the first and second semiconductor layers, Cl$_2$+O$_2$ as an etchant gas for the second tungsten silicide layer, and Cl$_2$ as an etchant gas for the barrier metal layer.

15. The method of claim 13, wherein the barrier metal layer serves as an etch stop layer during the first etching substep.

16. A method for forming an interconnection of a semiconductor device, comprising:

providing a semiconductor substrate having an impurity region at its surface;

forming an insulation layer having a contact hole over the impurity region;

forming a first semiconductor layer at inner walls and a bottom surface of the contact hole and over the insulation layer;

forming a barrier metal layer over the first semiconductor layer;

forming a second semiconductor layer over the barrier metal layer;

forming an amorphous first tungsten silicide layer over the second semiconductor layer;

annealing the amorphous first tungsten silicide layer to form a second tungsten silicide layer having a tetragonal crystal structure; and etching back the second tungsten silicide layer, the second semiconductor layer, the barrier metal layer and the first semiconductor layer sequentially and selectively so that an upper portion of the insulation layer can be exposed.

17. The method of claim 16, wherein the insulation layer consists of one chosen from the group consisting of an SOG film, a BPSG film and a PE-TEOS film.

18. The method of claim 16, wherein the first and second semiconductor layers are doped silicon layers.

19. The method of claim 18, wherein the first and second semiconductor layers are doped with an identical impurity.

20. The method of claim 16, wherein the barrier metal layer consists of one chosen from the group consisting of TiN, Ti/TiN and TiW.

21. The method of claim 16, wherein the first tungsten silicide layer is formed by chemical vapor deposition.

22. The method of claim 16, wherein the annealing step is performed at a temperature of about 900 to 1200° C. for about 10 to 40 minutes.

23. The method of claim 22, wherein the annealing step is performed under a nitrogen atmosphere.

24. The method of claim 16, wherein the barrier metal layer serves as a diffusion stop layer for preventing an impurity of the first tungsten silicide layer from being diffused into the first semiconductor layer during the annealing step.

25. The method of claim 16, wherein the etching back step comprises:

a first etching back substep for etching the second tungsten silicide layer and the second semiconductor layer; and a second etching back substep for etching the barrier metal layer and the first semiconductor layer.

26. The method of claim 16, wherein the etching step uses HBr+O$_2$ as an etchant gas for the first and second semiconductor layers, Cl$_2$+O$_2$ as an etchant gas for the second tungsten silicide layer, and Cl$_2$ as an etchant gas for the barrier metal layer.

27. The method of claim 25, wherein the barrier metal layer serves as an etch stop layer during the first etching back substep.

* * * * *